United States Patent [19]
Glomb, Jr.

[11] Patent Number: 4,655,560
[45] Date of Patent: Apr. 7, 1987

[54] DEMAGNETIZATION COMPENSATED DEFORMABLE MAGNETOSTRICTIVE MIRROR

[75] Inventor: Walter L. Glomb, Jr., Ellington, Conn.

[73] Assignee: United Technologies Corporation, Hartford, Conn.

[21] Appl. No.: 762,479

[22] Filed: Aug. 5, 1985

[51] Int. Cl.⁴ .......................... G02B 7/18; G02B 5/10
[52] U.S. Cl. .................................. 350/611; 350/360; 350/607; 350/629; 350/632
[58] Field of Search ...................... 350/360, 607–611, 350/613, 623, 624, 626, 629, 630, 631, 632

[56] References Cited

U.S. PATENT DOCUMENTS

| | | |
|---|---|---|
| 3,514,776 | 5/1970 | Mulready ..................... 350/611 X |
| 3,827,782 | 8/1974 | Boudouris et al. ............. 350/611 X |
| 3,966,308 | 6/1976 | Nilson ............................ 350/610 |
| 4,196,972 | 4/1980 | Rawlings ........................ 350/611 |
| 4,202,605 | 5/1980 | Heinz ............................. 350/613 |
| 4,266,857 | 5/1981 | Svenson ........................ 350/610 |
| 4,588,268 | 5/1986 | Aldrich .......................... 350/607 |

Primary Examiner—John Petrakes
Attorney, Agent, or Firm—Eric W. Petraske

[57] ABSTRACT

A demagnetization compensated deformable magnetostrictive mirror comprises an array of magnetostrictive actuators that are positioned between a continuous low magnetic reluctance yoke. A faceplate having a reflective surface and a substrate are both fabricated to receive the magnetic yoke's outer surface and are affixed thereto to be approximately perpendicular to the mirror's deformation axis.

5 Claims, 2 Drawing Figures

DEMAGNETIZATION COMPENSATED DEFORMABLE MAGNETOSTRICTIVE MIRROR

The Government has rights in this invention pursuant to Contract No. F29601-83-C-0059 awarded by the Department of the Air Force.

DESCRIPTION

1. Technical Field

This invention relates to deformable mirrors, and more particularly to deformable mirrors having magnetostrictive actuators.

2. Background Art

Mirrors possessing deformable surfaces are well known in the art, and have found extensive use in advanced high energy laser systems. The coherent light from a laser has surfaces of constant phase which are distorted while oropagating through the atmosphere. In addition to reflecting the beam, deformable mirrors provide a correction for this environmentally generated wavefront distortion. Deformable mirrors are characterized by a reflective surface behind which is positioned an array of externally controllable piezoelectric or magnetostrictive actuators. Upon receipt of an external signal the actuators will exert a force upon the reflective surface and deform the originally planar surface into a surface whose geometry will provide the reflected wave with coherent phase.

As is well known in the art, magnetostrictive actuators comprise at least one electrical coil which encloses a cylindrical rod of material whose physical dimensions change as a function of an applied magnetic field. Current flow in the low voltage electrical coils generates a magnetic flux within the rod and changes the length thereof.

The prior art contains a number of magnetostrictive actuators where the magnetostrictive rod is comprised of material such as terfenol ($Tb_{0.27} Dy_{0.73} Fe_{1.95}$). Terfenol possesses a very large magnetostrictive coefficient but is plagued by large displacement hysteresis.

Another magnetostrictive material is an iron-cobalt magnetostrictive metalic glass, such as METGLAS® 2605CO ($Fe_{0.67} Co_{0.18} B_{0.14} Si_{0.01}$). METGLAS® is quite desirable for precision displacement applications, as it displays virtually no hysteresis. Unfortunately, METGLAS® is an extremely low gain material so that linear actuators using METGLAS® display a very small amount of extension per unit solenoid current. Moreover, a large demagnetizing field is created within the material because of the high magnetic permeability of the METGLAS® compared with that of the surrounding air. The effect of this demagnetizing field is to cause the magnetostrictive characteristics of an actuator containing METGLAS® to be nonlinear and to require a large applied magnetic field for operation.

In an attempt to overcome this limitation, some magnetostrictive actuators of the prior art contain demagnetization compensation. This demagnetization compensation comprises a magnetic yoke, preferably METGLAS®, which is contained within the actuator housing itself and provides a low magnetic reluctance return for the magnetic flux within the actuator. Although performance is improved, each individual actuator must have its own internal demagnetization compensation components.

Deformable mirrors used in high energy laser applications require thousands of actuators to provide the reflected beam with sufficiently precise phase correction. Therefore, actuators with separate and discrete demagnetization compensation adds to the expense and complexity of the deformable mirror.

DISCLOSURE OF INVENTION

An object of the present invention is to provide a deformable magnetostrictive mirror that has a magnetic yoke for demagnetization compensation.

According to the present invention a demagnetization compensated deformable magnetostrictive mirror that is responsive to external signals comprises a substrate having a major surface oriented perpendicular to a deformation axis. A magnetostrictive actuator array is located in register with the substrate's major surface and includes a plurality of actuators of magnetostrictive material. Each of the actuators has a means of excitation that provides a magnetic flux therein and produces an extension thereof along a displacement axis parallel to the deformation axis in response to the external signals. Also included is a magnetic yoke that has continuous inner and outer surfaces and is positioned between and in contact with the magnetostrictive actuator array and the substrate. The magnetic yoke provides a low magnetic reluctance return for the magnetic flux. In addition a faceplate is provided that has both a reflective surface and an opoosed backing approximately perpendicular to the deformation axis. An interface means is disposed on the back surface and is formed to receive the magnetic yoke outer surface and is disposed thereon in register with the magnetostrictive actuator array.

BEST MODE FOR CARRYING OUT THE INVENTION

Figure 1:
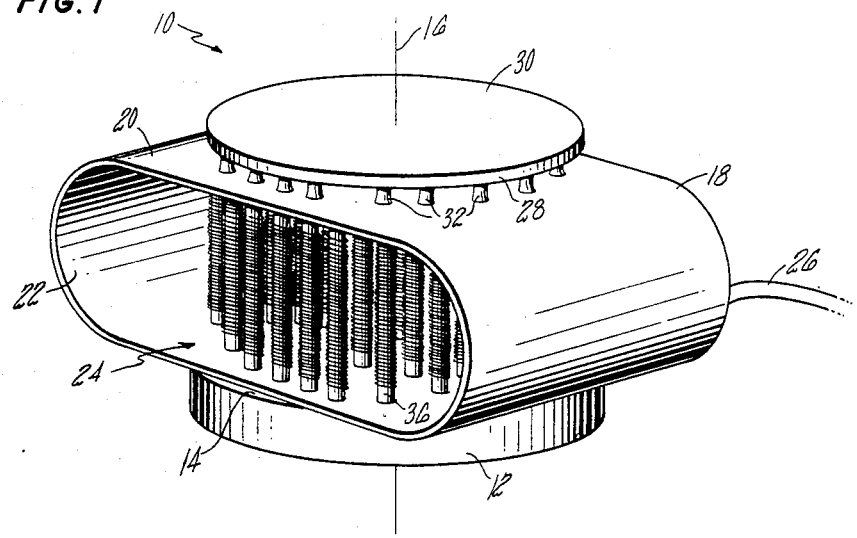
FIG. 1 is a perspective illustration of a demagnetization compensation deformable magnetostrictive mirror provided according to the present invention.

Referring first to FIG. 1, in a perspective illustration of a demagnetization compensated deformable magnetostrictive mirror provided according to the present invention, the demagnetization compensated deformable magnetostrictive mirror 10 includes baseplate 12 comprising aluminum or equivalent material fashioned into an approximately 20 cm diameter, 1.25 cm thick block. The baseplate has a major surface 14 perpendicular to mirror deformation axis 16 for receiving a low reluctance magnetic yoke 18 that has a continuous outer surface 20 and a continuous inner surface 22. In the best mode embodiment the yoke comprises approximately twenty layers of two inch wide No. 2605SC METGLAS® wound in a twelve inch circumference band. A portion of the outer surface is fastened on the major surface of the substrate by conventional techniques such as bonding with Epotech epoxy.

Positioned on the magnetic yoke inner surface is an array 24 of magnetostrictive actuators, each of which is responsive to external signals provided thereto on lines 26 by position command circuitry that is not shown and is not part of the present invention. FIG. 1 illustrates only a few of the actuators which comprise array 24. In the best mode embodiment the array comprises approximately 1,000 actuators in an approximately hexagonal arrangement. The actuators are of a type known in the art and comprise cylindrical rods of magnetostrictive material such as terfenol or METGLAS ® as in the best mode embodiment. The rods are bounded by faces (not shown) at either end of the cylinders and are aporoximatelv 10 cm long and 6 mm in diameter, wrapped with approximately 1,000 turns of No. 28 wire. The actuators draw approximately 500 milliamps of current in generating approximately 5 microns of extension.

Figure 2:
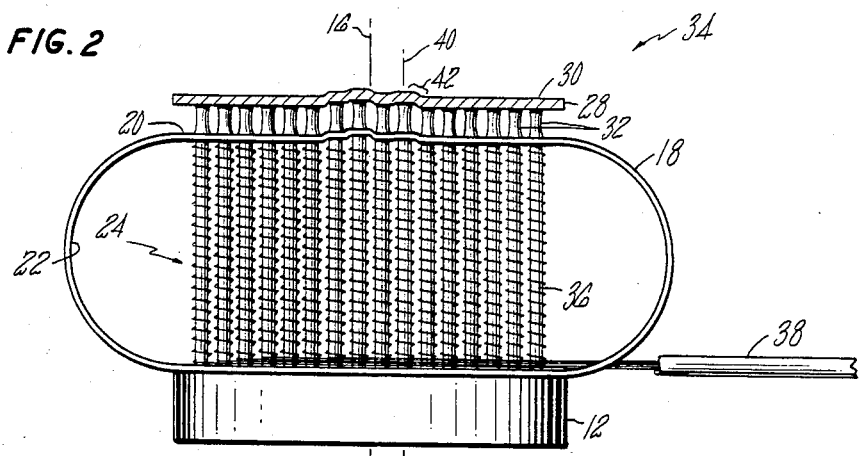
FIG. 2 is a sectioned illustration of the deformable mirror of FIG. 1 in operation after assembly.

The actuator array is located with one face of each actuator in contact with the yoke inner surface such that a displacement axis of each actuator detailed hereinafter with respect to FIG. 2 is perpendicular to the major surface of the substrate and parallel to the deformation axis of the mirror. The other face of the actuators abut another section of the yoke's inner surface.

Faceplate 28 is characterized by a deformable reflective surface 30 and a parallel backing surface (not shown). Both are substantially perpendicular to the mirror's deformation axis. Attached to the backing surface by brazing or other conventional techniques is a means for interfacing the faceplate with the magnetic yoke's outer surface and comprises an array 32 of connecting standoffs in the best mode embodiment. The standoffs, which comprise a metal pedestal of a type known in the art, are spaced across the backing surface of the mirror, one standoff per actuator, in register therewith. The interstices in the array can be empty but in the best mode embodiment carry a flow of conventional coolant (gas or liquid) around the coils to remove heat generated during the actuator operation.

To assemble the mirror, the magnetostrictive actuators are positioned by techniques known in the art into an approximate hexagonal array for the circular mirror shown. Those skilled in the art will note that other mirror and array geometries may be equivalently substituted. The magnetostrictive actuators are machined at both ends so that each cylinder end face (not shown are flat and parallel relative to the other actuator end faces in the array to less than fifty microns. The magnetic yoke is positioned over the array so that the yoke's inner surface is in contact therewith. The substrate is attached by an Epotech epoxy or by equivalent techniques to the outer surface of the yoke perpendicular to the actuator's displacement axis. The faceplate with the array of standoffs already attached is bonded to the magnetic yoke's outer surface so that each actuator in the array is in register with a corresponding standoff.

FIG. 2 is a sectioned illustration 34 of the demagnetization compensated magnetostrictive actuator of FIG. 1 in operation after assembly. The dimensions of the elements contained therein have been exaggerated for illustrative purposes.

In operation, the position command circuitry provides position command signals to an individual actuator 36 in the actuator array (24,FIG. 1) on lines 38. The actuator responds to the position signal magnitude by producing an extension along displacement axis 40, which is parallel to the mirror's deformation axis (16, FIG. 1). As a result, a section 42 of the mirror's deformable reflective surface (30, FIG. 1) is moved locally along the mirror's deformation axis. Those skilled in the art will note that each actuator in the array will have a corresponding displacement axis and produce a similar deformed section of the reflective surface in response to the magnitude of similar position command signals received along corresponding signal lines.

As is well known in the art, the current component of the position command signal will induce a magnetic field within the electrical coil of an actuator. It is well known that magnetostrictive metallic glasses such as METGLAS ® experience a stress when placed in an applied magnetic field. In the case of an actuator which is fixed at one end by the substrate and magnetic yoke, the concomitant strain within the actuator produces a change in actuator length that displaces the section of the mirror's deformable reflective surface which is in register with that actuator.

The displacement (D) of an actuator is expressed as $$D = HKl_c$$

where H is the magnetizing field, K is the strain gain constant, and $l_c$ is the quiescent length of the magnetostrictive actuator.

In the best mode embodiment the magnetostrictive actuators operate in an extension mode only. Those skilled in the art will note that if a small bias magnetic field is present, the actuators can be made to produce both extension and contraction. As is also well known, a supplemental current flow through the coil or an equivalent magnetic biasing means would be necessary to produce the desired bias magnetic field and the resultant displacement about a bias point.

Without the magnetic yoke configuration, the magnetic flux of the applied field would exit the high magnetic permeability region of the magnetostrictive actuator into the low magnetic permeability region of the surrounding air. The air outside the cylinder produces a very high magnetic reluctance return path for the magntic flux. Physically this results in a large number of uncompensated magnetic poles being created at either end face of each magnetostrictive actuator.

The presence of uncompensated magnetic poles reduces the magnitude of the applied magnetic field within the magnetostrictive material by an amount ΔH, called a demagnetizing field, and is nearly proportional to the intensity of the magnetization. The effective magnetic field (H) within the magnetostrictive displacement cylinder is the difference between the applied field (H₀) and the demagnetizing field, or $$H = H_0 - \Delta H.$$

The effect of the demagnetizing field is largest with those magnetostrictive materials which possess a high magnetic permeability. Iron cobalt metallic glasses such as METGLAS ® have a magnetic permeability approximately ten thousand times that of air. Consequently, the magnitude of the demagnetizing field within the displacement cylinder of METGLAS ® is quite large when used in magnetostrictive actuators.

In order to reduce the magnitude of this demagnetizing field, a low magnetic reluctance path for the magnetic flux associated with a magnetostrictive actuator must be provided. The magnetic yoke supplies this return path for the magnetic flux of the applied field. This magnetic yoke configuration reduces the demagnetizing field within the displacement cylinder, increasing the gain and linearity of the actuator. Although METGLAS comprises the magnetic yoke in the best mode embodiment those skilled in the art will note that other equivalent materials may be substituted. The material which comprising the magnetic yoke must possess the proper magnetic reluctance characteristics which deoend on the materials that comprise the magnetostrictive actuator array. The material comprises the magnetic yoke need not be magnetostrictive itself.

Wavefront distortion of the incoming laser beam is compensated by precisely deforming the mirror's reflective surface. To achieve high resolution, large densely packed arrays of magnetostrictive actuators must be employed which places a premium on space utilization. A demagnetization compensated deformable magnetostrictive mirror provided according to the present invention reduces the hardware associated with each magnetostrictive actuator by providing for a common external low magnetic reluctance return path for the different magnetic fluxes of the actuators in the form of a magnetic yoke.

Those skilled in the art will note that the effectiveness of the magnetic yoke configuration in reducing the magnitude of the demagnetizing fields is greatly influenced by magnetic permeability changes from material to material. Therefore, gaps of any magnitude in the contact regions between the magnetostrictive actuators and the common magnetic yoke substantially reduce the performance of the deformable mirror. To eliminate the demagnetizing field of the actuators, the reluctance of the contacts must be made much smaller than that of the yoke so $$\pi l / \mu t\, w >> 4\, l_g / \pi d^2$$

where w is the width of the yoke, $l_g$ is the gap length, $\mu$ is the relative permeability of the METGLAS ®, t is the yoke thickness and l is the length of a given actuator in the actuator array. To be effective, the yoke cross-sectional area, wt, should be about equal to the cross-sectional area of the actuator array, $\pi d^2/4$. With such a configuration the inequality can be approximated by $$l << \pi l \mu$$

where $l \sim 5$ cm and $\mu > 10^3$ for METGLAS ® so l $<<150$ microns (0.006 in.). In the best mode embodiment the magnetostrictive actuators and magnetostrictive yoke are fabricated so that any gaps therebetween are less than fifty micrometers in dimension.

Similarly, although the invention has been shown and described with respect to a best mode embodiment thereof, it should be understood by those skilled in the art that various other changes, omissions, and additions thereto may be made therein without departing from the spirit and scope of the invention.

I claim:

1. A demagnetization compensated deformable magnetostrictive mirror responsive to external signals, comprising:

substrate means having a major surface approximately perpendicular to a deformation axis;

magnetostrictive actuator array means including a plurality of actuators of magnetostrictive material, each of said actuators having excitation means responsive to the external signals for providing a magnetic flux therein producing an extension thereof along a displacement axis aporoximately parallel to said deformation axis, said magnetostrictive actuator array located in register with said substrate means major surface;

magnetic yoke means having continuous inner and outer surfaces positioned between and in contact with said magnetostrictive actuator array and said substrate means for providing a low magnetic reluctance return for said magnetic flux;

faceplate means having opposed reflective and backing surfaces approximately perpendicular to said deformation axis said faceplate means further including interface means affixed to said back surface formed to receive said magnetic yoke means outer surface and disposed thereon in register with said magnetostrictive actuator array.

2. The demagnetization compensated deformable magnetostrictive mirror of claim 1, wherein said magnetostrictive material comprises an iron-cobalt metallic glass having relative numbers of atoms per unit volume of substantially $Fe_{0.67} Co_{0.18} B_{0.14} Si_{0.01}$.

3. The demagnetization compensated deformable magnetostrictive mirror of claim 1, wherein said interface means comprises an array of standoffs, each standoff positioned in register with each of said actuators of said magnetostrictive actuator array.

4. The demagnetization compensated deformable magnetostrictive mirror of claim 1, wherein said magnetostrictive yoke means comprises an iron-cobalt metallic glass having relative numbers of atoms per unit volume of substantially $Fe_{0.67} Co_{0.18} B_{0.14} Si_{0.01}$.

5. The demagnetization compensated deformable magnetostrictive mirror of claim 1, wherein said excitation means comprises an electrical coil.

* * * * *